(12) United States Patent
Seghizzi et al.

(10) Patent No.: US 11,276,789 B2
(45) Date of Patent: Mar. 15, 2022

(54) METHOD OF MANUFACTURING AN INTEGRATED COMPONENT WITH IMPROVED SPATIAL OCCUPATION, AND INTEGRATED COMPONENT

(71) Applicant: STMicroelectronics S.r.l., Agrate Brianza (IT)

(72) Inventors: Luca Seghizzi, Milan (IT); Linda Montagna, Torre d'Isola (IT); Giuseppe Visalli, Gorgonzola (IT); Mikel Azpeitia Urquia, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/744,865

(22) Filed: Jan. 16, 2020

(65) Prior Publication Data

US 2020/0235251 A1    Jul. 23, 2020

(30) Foreign Application Priority Data

Jan. 22, 2019    (IT) .................. 102019000000917

(51) Int. Cl.
| | | |
|---|---|---|
| *H01L 31/0232* | (2014.01) | |
| *H01L 31/02* | (2006.01) | |
| *H01L 31/0203* | (2014.01) | |
| *H01L 31/113* | (2006.01) | |
| *H02N 1/00* | (2006.01) | |
| *G02B 26/08* | (2006.01) | |

(52) U.S. Cl.
CPC .... *H01L 31/02325* (2013.01); *G02B 26/0841* (2013.01); *H01L 31/0203* (2013.01); *H01L 31/02005* (2013.01); *H01L 31/1136* (2013.01); *H02N 1/004* (2013.01)

(58) Field of Classification Search
CPC ......... H01L 31/02325; H01L 31/02005; H01L 31/0203; H01L 31/1136
See application file for complete search history.

(56) References Cited

U.S. PATENT DOCUMENTS

2015/0381177 A1* 12/2015 Canegallo .......... G01R 31/2886
                                                              326/82
2019/0277703 A1*  9/2019 Valouch ................ G01J 5/0812

FOREIGN PATENT DOCUMENTS

EP            1151962 A1      11/2001

OTHER PUBLICATIONS

IT Search Report and Written Opinion for IT Appl. No. 102019000000917 dated Sep. 23, 2019 (7 pages).
Szentkut, Andras, et al: "Infrared Thermography and Image Analysis for Biomedical Use," Periodicum Biologorum, vol. 113, No. 4, 385-392, 2011.

(Continued)

*Primary Examiner* — Seahvosh Nikmanesh
(74) *Attorney, Agent, or Firm* — Crowe & Dunlevy

(57) ABSTRACT

A first wafer of semiconductor material has a surface. A second wafer of semiconductor material includes a substrate and a structural layer on the substrate. The structural layer integrates a detector device for detecting electromagnetic radiation. The structural layer of the second wafer is coupled to the surface of the first wafer. The substrate of the second wafer is shaped to form a stator, a rotor, and a mobile mass of a micromirror. The stator and the rotor form an assembly for capacitively driving the mobile mass.

18 Claims, 11 Drawing Sheets

(56) References Cited

OTHER PUBLICATIONS

Rubal, Bernard J., et al: "Liquid Crystal Thermography, A New Tool for Evaluating Low Back Pain," Physical Therapy, vol. 62, No. 11, Nov. 1982, pp. 1593-1596.
Ring, E.F.J., et al: "Quality Assurance for Thermal Imaging Systems in Medicine," Thermology International, Jul. 2007 (5 pages).
"Potential Application of Nanoparticles in Medicine: Cancer Diagnosis and Therapy," https://nanoed.tu.cz/mod/resource/view.php?id=1592 (date unknown) (64 pages).

* cited by examiner

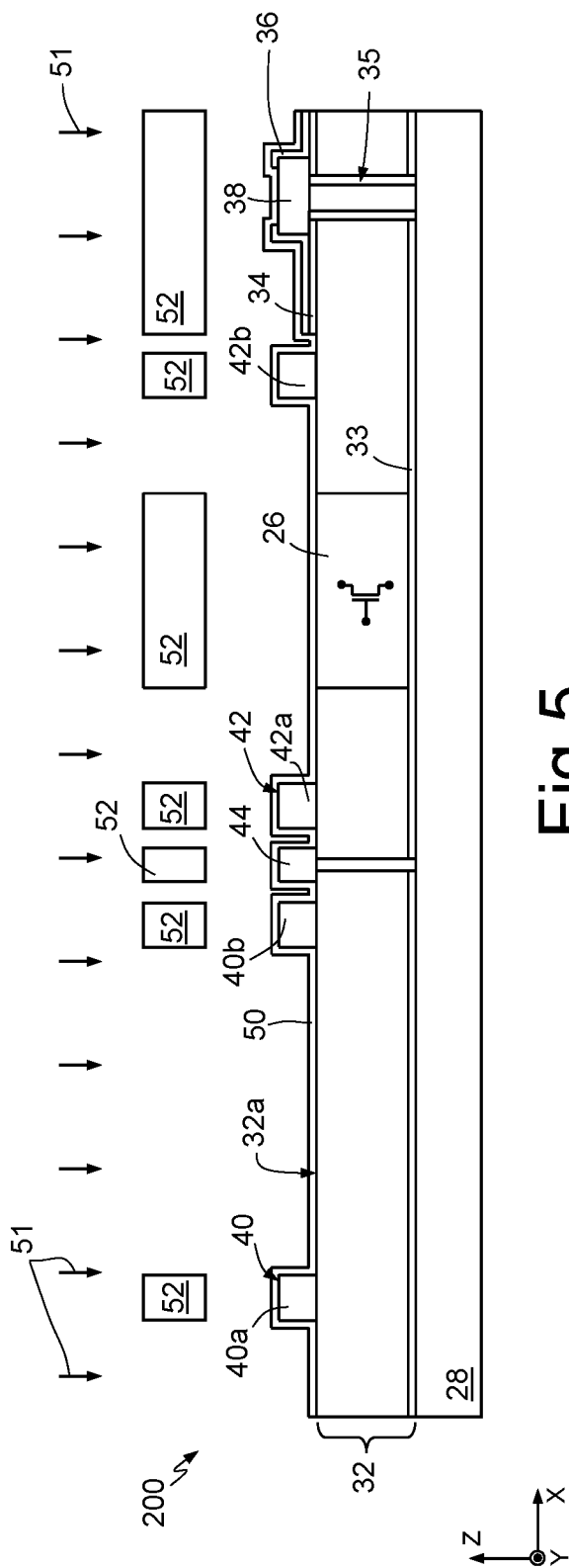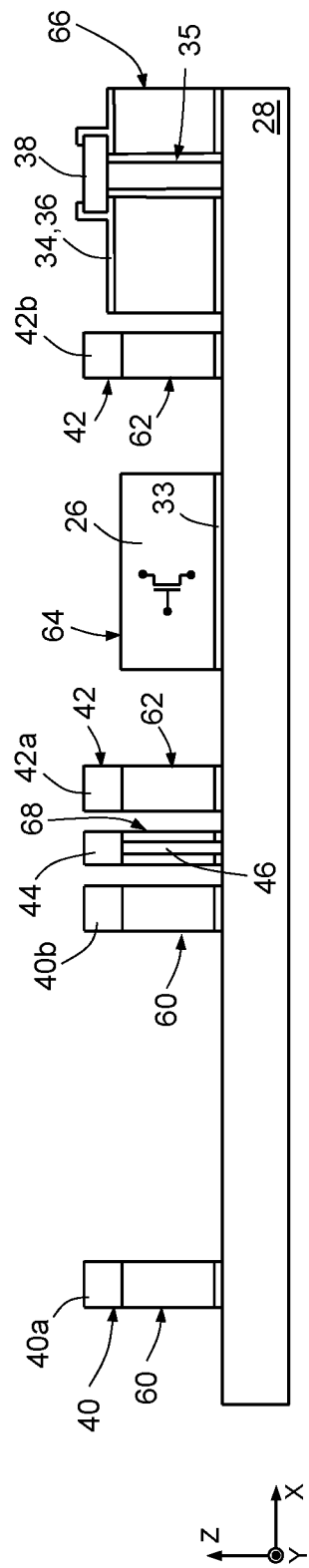

METHOD OF MANUFACTURING AN INTEGRATED COMPONENT WITH IMPROVED SPATIAL OCCUPATION, AND INTEGRATED COMPONENT

PRIORITY CLAIM

This application claims the priority benefit of Italian Application for Patent No. 102019000000917, filed on Jan. 22, 2019, the content of which is hereby incorporated by reference in its entirety to the maximum extent allowable by law.

TECHNICAL FIELD

The present invention relates to a method of manufacturing an integrated component, and to the integrated component. In particular, the present invention relates to a method of manufacturing a component comprising a micromirror and a thermal MOS (TMOS) transistor, in particular adapted to be used in a system for 3D reconstruction of a body irradiated with radiation in the near infrared (NIR).

BACKGROUND

Medical examinations of a known type envisage generation of 3D images obtained starting from a body irradiated with NIR radiation, enabling reconstruction of the thermal spectrum of the body itself and consequently identification of potential illnesses or disorders, such as rheumatoid arthritis, Raynaud's syndrome, osteoarthritis of the knee, etc. Various systems are known in the art for carrying out such medical examinations, which require both a light source in the NIR spectrum for irradiating via incident radiation the portion of body of the patient under examination, and a detector adapted to measure the radiation coming out of the portion of irradiated body. Wide and poorly localized beams of incident radiation are thus generated, with consequent reduction of precision and accuracy of the signal that is emitted by the body under examination and is acquired by the detector.

Detectors of a known type envisage use of a thermal MOS (TMOS) transistor. The TMOS transistor is a field-effect transistor device typically used in sensor applications for determining the amount of radiation emitted by an object or body under examination. The radiation emitted, received by the TMOS transistor, causes generation of charge carriers at the conductive channel of the TMOS transistor and, hence, a variation of the output current; the output current can be set in relation with the amount of radiation emitted by the object under examination.

It is moreover known in the art to use a mirror of micrometric dimensions (i.e., a micromirror of the microelectromechanical system (MEMS) type) in order to deflect and direct the radiation that is to impinge upon the body under examination towards a specific region of the body. Generally, the micromirror is obtained by depositing a metal, such as gold or aluminum, on a mobile mass of a die, in order to create a reflecting surface (e.g., so as to achieve a reflectivity higher than 98%). Actuation of the mobile mass of the micromirror is typically of a piezoelectric, capacitive, or magnetic type.

In particular, actuation of a capacitive type is made possible via electric currents that are supplied to a stator and to a rotor of the micromirror. Such electric currents generate a difference of capacitance across the mobile mass of the micromirror so that said mass, subjected to a twisting moment, can be controlled. The micromirror is typically driven at the resonance frequency of the mobile mass.

Systems of a known type present various disadvantages. In particular, systems of a known type are constituted by numerous components physically separated from one another. This leads to an increase in the dimensions of the system as a whole and a difficulty in obtaining a synergistic operation of the components of said system (e.g., there exists an effective difficulty in orienting the radiation on a specific point of the body to be analyzed and detecting the radiation emitted by the body with a high degree of precision).

There is a need in the art to provide a method of manufacturing an integrated component, and a corresponding integrated component, that will overcome the limits of the prior art.

SUMMARY

According to the present invention, a method of manufacturing an integrated component, and an integrated component are provided.

In an embodiment, a method of manufacturing an integrated component comprises: providing a first wafer of semiconductor material, having a surface; providing a second wafer of semiconductor material, including a substrate and a structural layer on the substrate, the structural layer integrating a detector device for detecting electromagnetic radiation; coupling the structural layer of the second wafer to the surface of the first wafer; and processing the substrate of the second wafer to form a stator, a rotor, and a mobile mass of a micromirror, said stator and rotor forming a capacitive-driving assembly for capacitively driving the mobile mass.

In an embodiment, an integrated component comprises: a first wafer of semiconductor material, having a surface; and a second wafer of semiconductor material, including a substrate and a structural layer on the substrate, the structural layer integrating a detector device for detecting electromagnetic radiation, wherein the structural layer of the second wafer is coupled to the surface of the first wafer, and wherein a stator, a rotor, and a mobile mass of a micromirror are integrated in the substrate of the second wafer, said stator and rotor forming a capacitive-driving assembly for capacitively driving the mobile mass.

BRIEF DESCRIPTION OF THE DRAWINGS

For a better understanding of the present invention, a preferred embodiment thereof is now described, purely by way of non-limiting example, with reference to the attached drawings, wherein:

FIGS. 1-11 show, in a side cross-section view, steps for manufacturing an integrated component according to an embodiment;

DETAILED DESCRIPTION

Figure 10A:
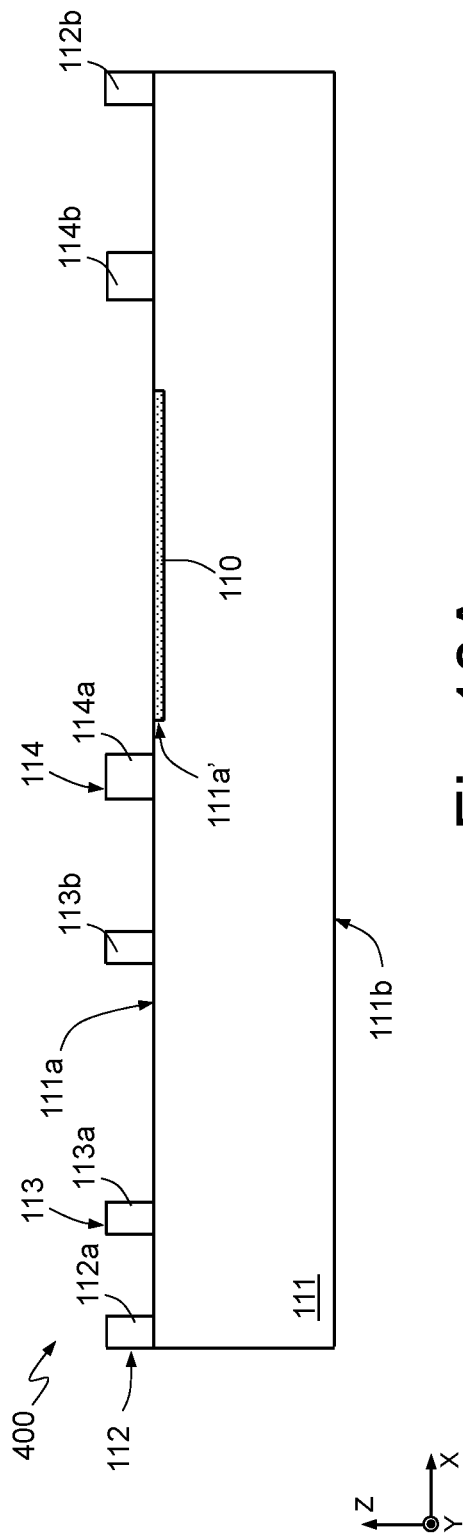
Figure 10B:
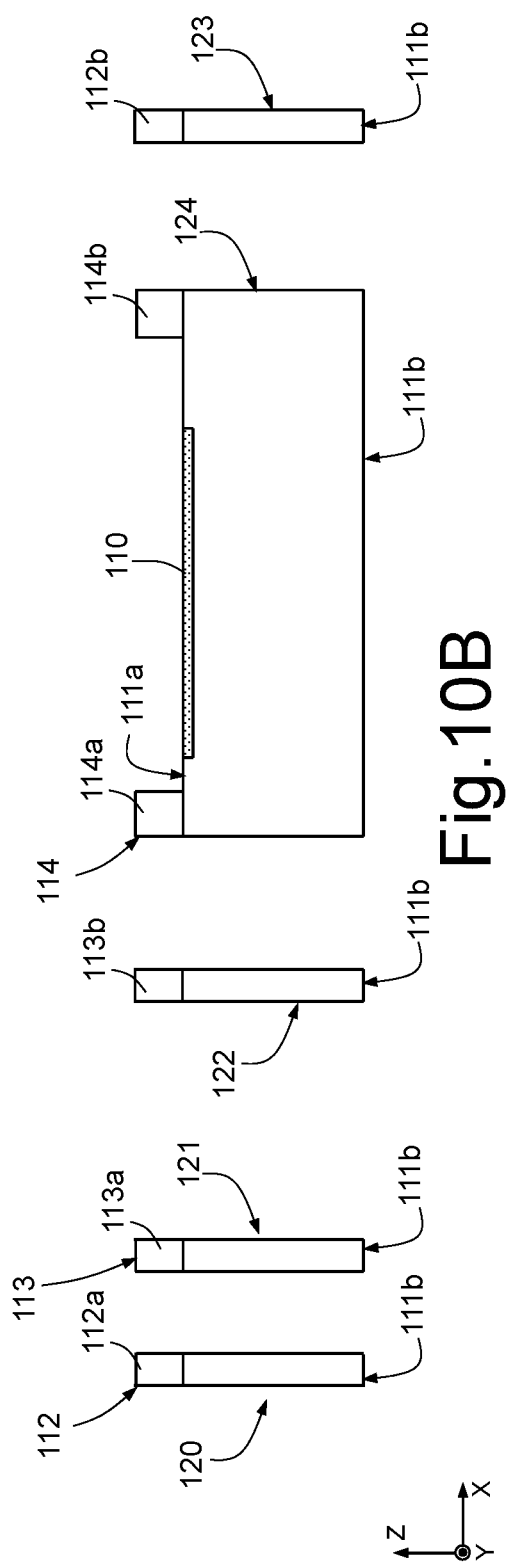
Figure 11:
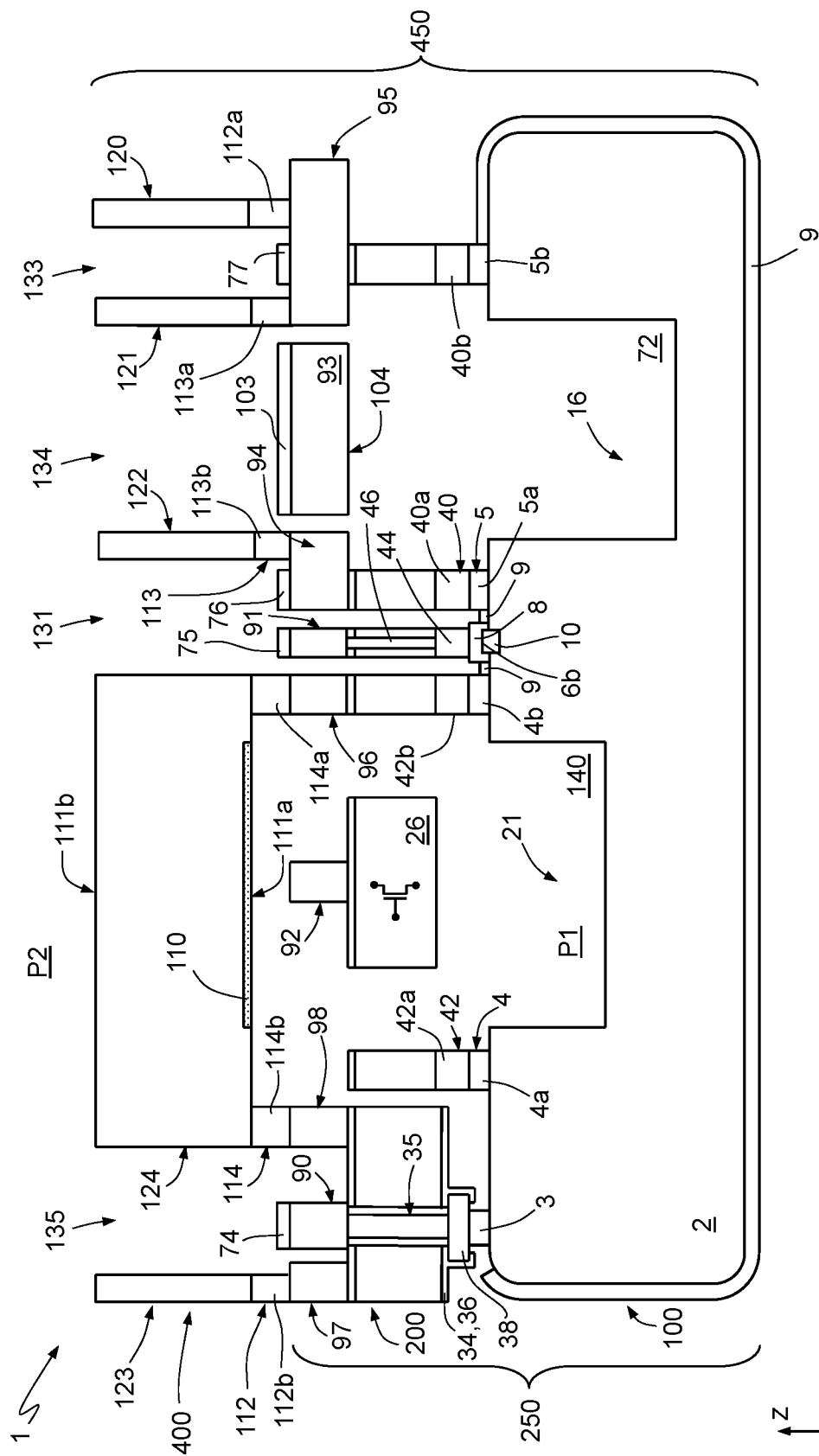

FIGS. 1-11 illustrate, in a side cross-section view, in a triaxial Cartesian reference system with X, Y, and Z axes, steps of manufacturing an integrated component 1 illustrated as a whole in FIG. 11. The integrated component 1 comprises a detector device, in particular a thermal MOS (TMOS) transistor, and a micromirror, in particular obtained via MEMS technology, as illustrated more fully in what follows.

Figure 1:
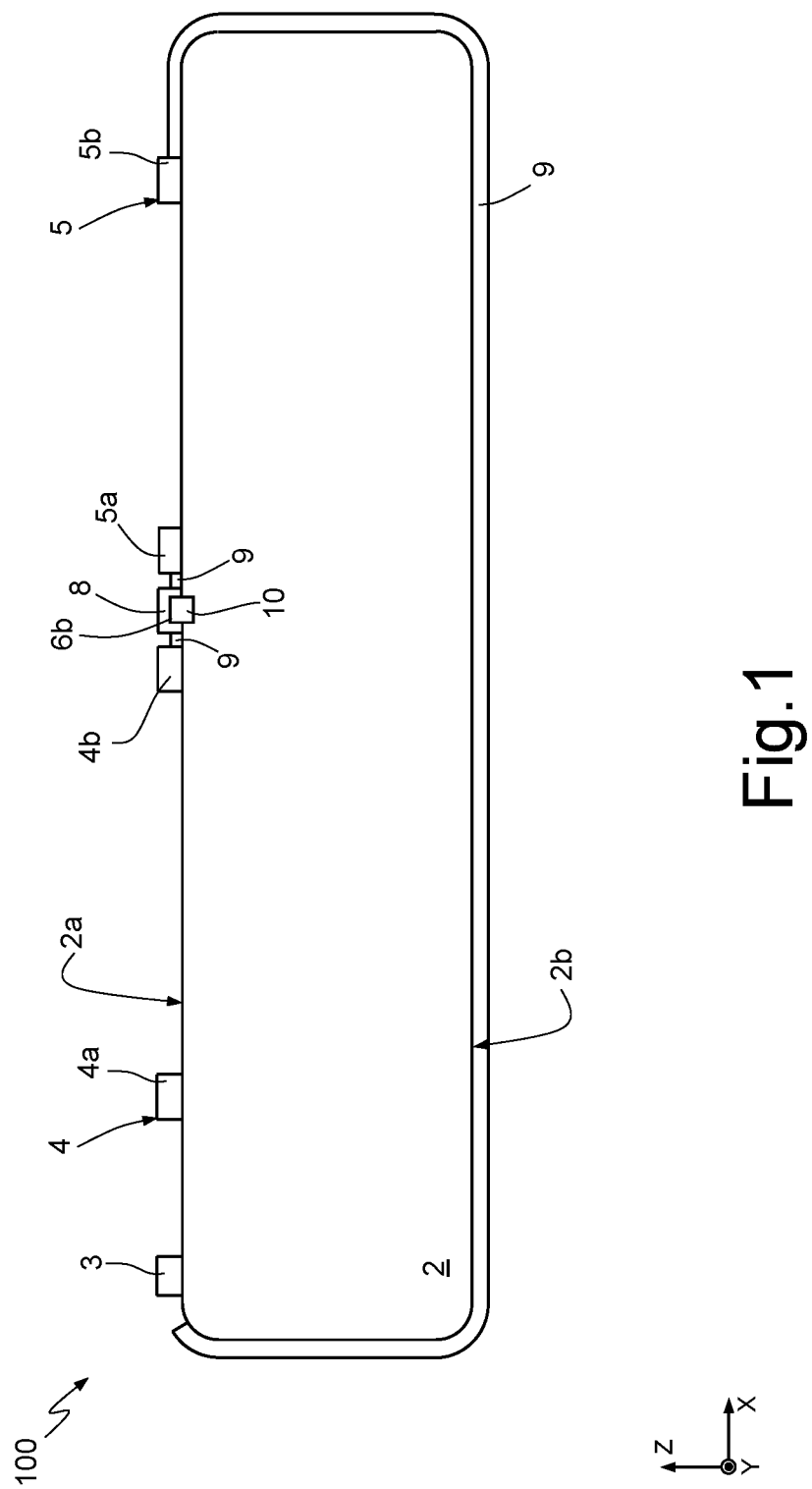

With reference to FIG. 1, a first wafer 100 is arranged, including a substrate 2, made of semiconductor material such as silicon, which includes a top surface 2a opposite, along the Z axis, to a bottom surface 2b. The thickness of the substrate 2, measured along the Z axis, between the top surface 2a and the bottom surface 2b ranges, for example, between 300 μm and 600 μm. An insulating layer 9, here made of silicon oxide (thermal oxide), surrounds the substrate 2 and has, by way of example, a thickness of approximately 1 μm.

Once again with reference to FIG. 1, the insulating layer 9 is shaped by means of lithographic and etching steps in themselves known in the art in order to remove selective portions thereof at the top surface 2a. More particularly, the insulating layer 9 is removed from regions of the top surface 2a where at least two bonding rings are to be formed, where a first bonding ring is identified by the reference number 4 (with sections 4a and 4b) and a second bonding ring is identified by the reference number 5 (with sections 5a and 5b). Moreover, the insulating layer 9 is likewise removed from regions of the top surface 2a where at least one bonding pad 3 and at least one metal contact 8 are to be formed. The insulating layer 9 is likewise removed from regions of the top surface 2a where trenches will be formed useful for operation of the TMOS transistor and of the micromirror, in particular in portions of the top surface 2a internally delimited by the bonding rings 4 and 5, as illustrated more fully hereinafter.

A step of masked implantation is then carried out, in a way in itself known in the art, to form, in a position corresponding to the top surface 2a, an implanted doped region 10, in particular of an N type. The implanted doped region 10 extends in a portion of the top surface 2a ranging between the bonding ring 4 and the bonding ring 5.

Formation of the bonding rings 4 and 5, of the bonding pad 3, and of the metal contact 8 is obtained, in one embodiment, simultaneously, and includes a step of deposition of a metal layer on the top surface 2a of the substrate 2, in particular germanium deposited, for example by sputtering, and a subsequent step of photolithographic and etching definition of said deposited metal layer. The photolithographic step and the subsequent etching step are carried out using an appropriate mask, configured to define the desired shape and extension of the bonding rings 4 and 5, of the bonding pad 3, and of the metal contact 8 (according to the design specifications).

The bonding rings 4, 5 and the bonding pad 3 are formed in electrical contact with the substrate 2. The metal contact 8 is formed at, and in electrical contact with, the doped region 10. This doped region 10 provides an electrical connection between the metal contact 8 and the substrate 2; the metal contact 8 has, in use, the function of a ground reference terminal.

Figure 2:
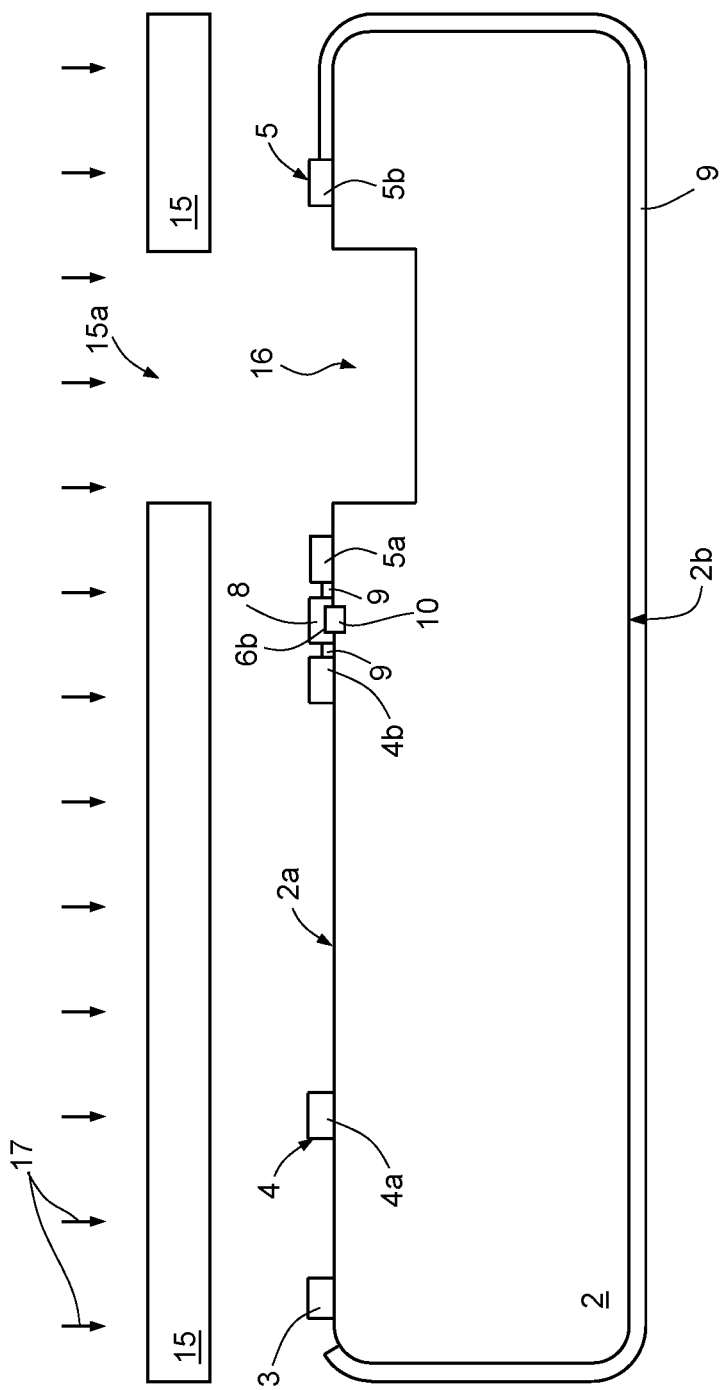

With reference to FIG. 2, a step of etching of the first wafer 100 is carried out to form a first trench 16 (useful for operation of the micromirror). For this purpose, a first mask 15 is used, which has a first opening 15a; the first mask 15 is such that, when used, it covers the top surface 2a of the substrate 2 except for a surface region of the substrate 2 that is designed to house the first trench 16 (i.e., at the first opening 15a). More in particular, the first trench 16 is formed inside the second bonding ring 5, i.e., in a cross-section view, between the sections 5a and 5b of the second bonding ring 5. A dry-etching step, represented by arrows 17, enables removal of portions of the substrate 2 not protected by the first mask 15. Dry etching proceeds to a depth $Z_1$, measured along the direction of the Z axis starting from the top surface 2a, of some tens of micrometers, for example 60 μm. According to one embodiment, the first trench 16 is provided by means of deep reactive ion etching (DRIE).

Then (FIG. 3), a second trench 21 is formed (useful for operation of the TMOS transistor), and formation of the first trench 16 is likewise completed, using a second etching mask 20. In particular, the second mask 20 has a first opening similar to the first opening 15a already present in the first mask 15 (and for this reason identified by the same reference number) and a second opening 20a at the surface region where the second trench 21 is to be formed. More in particular, the second trench 21 is formed inside the first bonding ring 4 (i.e., in a cross-section view, between the sections 4a and 4b of the first bonding ring 4).

By carrying out a dry etch (identified by the arrows 22), in particular of the same type as the etch represented in FIG. 2, the substrate 2 is selectively removed to form the second trench 21, and etching of the first trench 16 is continued. The etch represented in FIG. 3 proceeds until a depth of the first trench 16 is reached equal to approximately 160 μm along the Z axis, and a depth $Z_2$ of the second trench 21 is reached equal to approximately 100 μm (measured along the Z axis, starting from the top surface 2a).

The first trench 16 and the second trench 21 are set apart from each other, along the direction of the X axis in a cross-section view, by a distance $X_1$ equal to some hundreds of micrometres (for example, 100-200 μm).

A further etching step (e.g., via RIE), using the first mask 15 of FIG. 2 (or a similar mask, which has the opening 15a at the trench 16), is carried out so as to generate, in a way in known in the art, blackening of the first trench 16 in order to obtain black silicon. Black silicon has a high absorption coefficient of radiation, typically greater than 95%, in particular equal to, or higher than, 99% and is used for reducing, in use, an undesired reflection of light radiation from the first trench 16 towards the micromirror.

Other methods for reducing the reflectivity of the first trench 16 may be implemented, in a way in itself known to the person skilled in the art, for example, via deposition of non-reflecting material (e.g., carbon black, or other organic materials adapted for the purpose).

Figure 3:
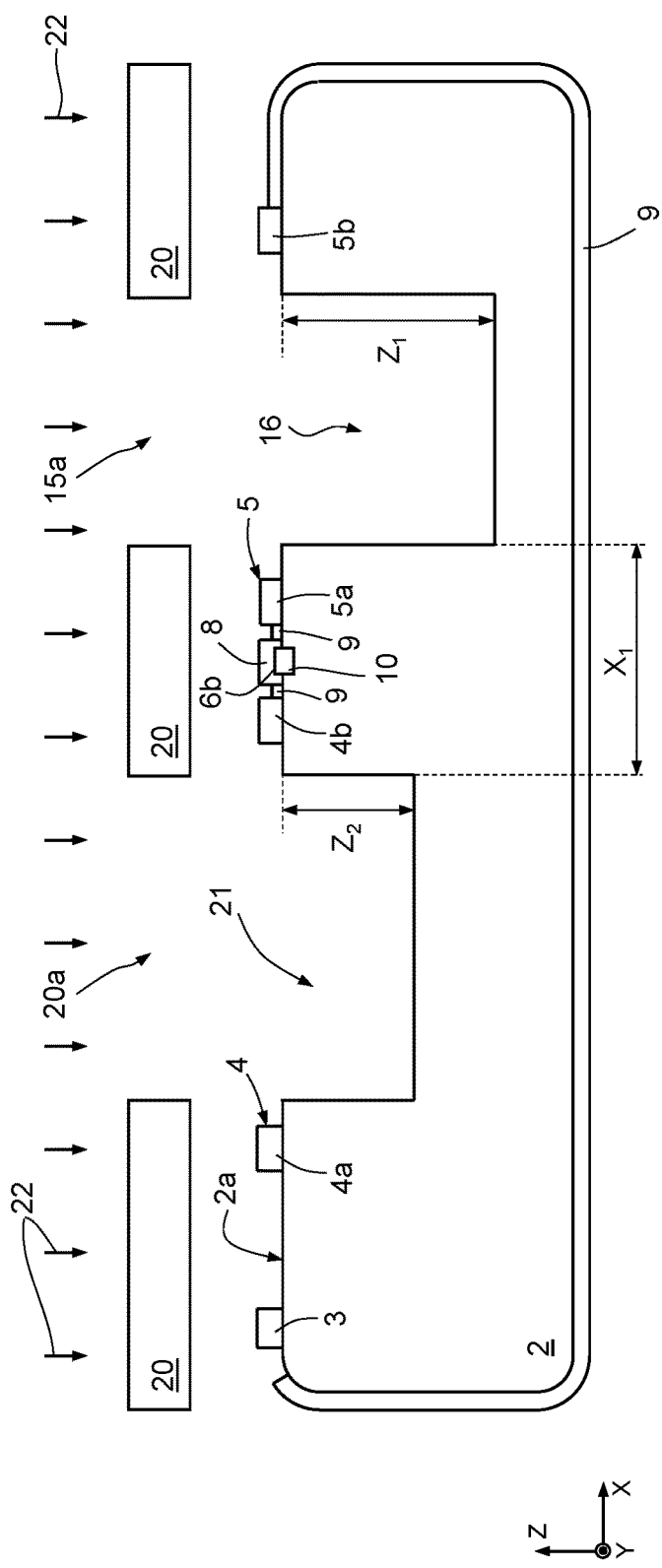

Alternatively, the step of blackening of the first trench can be carried out using the second mask 20 of FIG. 3; in this case, the process of blackening of the silicon causes, in addition to blackening of the first trench 16, also blackening of the second trench 21. In this embodiment, there is the advantage of speeding up the manufacturing steps in so far as the second mask 20 already present after the etching steps of FIG. 3 is exploited.

Figure 4:
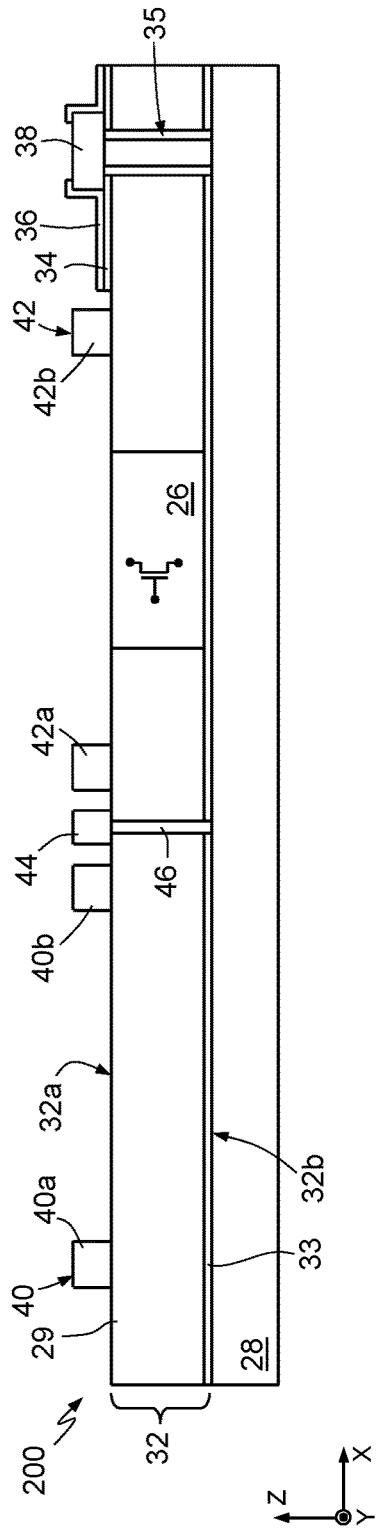

With reference to FIG. 4, a second pre-machined wafer 200 is now illustrated. The wafer 200 is shown in a side cross-section view, in the same triaxial reference system with the X, Y, and Z axes as that of FIG. 1.

The second wafer 200 is manufactured using CMOS technology via processes and techniques in themselves known in the art that do not form part of the present invention.

The second wafer 200 comprises a substrate 28 of semiconductor material (having a thickness ranging between 500 μm and 900 μm, preferably 750 μm), such as silicon, extending over which is a structural body 32. The structural body 32 has a first surface 32a and a second surface 32b, extending between which is a region 29 (e.g., including one or more layers of epitaxial silicon, dielectric layers, and metal layers) and an insulating layer 33 interposed between the region 29 and the substrate 28. The insulating layer 33 has the function of electrical insulator towards the substrate 28.

The second wafer 200 comprises a third bonding ring 40 (sections 40a and 40b are illustrated in FIG. 4) and a fourth bonding ring 42 (sections 42a and 42b are illustrated in FIG. 4). Both the third bonding ring 40 and the fourth bonding ring 42 are made of metal material chosen so that it will form a eutectic alloy with the metal material used to form the first and the second bonding rings 4, 5 of the wafer 100. In one embodiment, the metal material of the first and the second bonding rings 4, 5 is germanium, and the metal material of the third and fourth bonding rings 40, 42 is aluminum. Formation of the eutectic alloy includes a bonding step at a temperature ranging between 200° C. and 400° C. so as to thus generate a metal alloy between aluminum and germanium that provides permanent bonding.

In particular, when coupled together, the fourth bonding ring 42 and the first bonding ring 4 form a bond that guarantees an air-tight seal; i.e., it prevents passage of gas molecules (e.g., air) through it. The same applies to the coupling between the third bonding ring 40 and the second bonding ring 5.

According to one aspect of the present invention, the region 29 houses a TMOS transistor 26, integrated in the region 29 and set facing the first surface 32a of the structural body 32. The TMOS transistor 26 extends inside the fourth bonding ring 42. The TMOS transistor 26 is electrically coupled to a conductive pad 38 (made, for example, of germanium), which extends on the first surface 32a of the structural body 32, on the outside of the fourth bonding ring 42.

One or more conductive through vias 35, in electrical contact with the conductive pad 38, extend completely through the region 29 and the insulating layer 33, until they reach and contact the substrate 28. The one or more conductive through vias 35 are electrically insulated from the region 29. The conductive pad 38 is likewise in electrical connection with the TMOS transistor 26 and has the function of receiving the output signal of the TMOS transistor 26. For this purpose, the substrate 28 is of a doped type (e.g., of an N type), or has doped regions (e.g., of an N type), or conductive paths (e.g., metal paths) for conveying the signal of the TMOS transistor towards conductive pads, where said signal is acquired.

The conductive pad 38 is electrically insulated from the region 29 by a bottom dielectric layer 34, which extends between the conductive pad 38 and the region 29 except for the portion where the conductive through vias 35 are present, and is insulated, at the side, by means of a side dielectric layer 36. The dielectric layer 36 exposes a top portion of the conductive pad 38, to enable top electrical contact thereof, as illustrated more fully hereinafter.

A metal contact 44, having the function of a ground reference contact, extends on the first surface 32a of the structural body 32 between the third bonding ring 40 and the fourth bonding ring 42.

A conductive through via 46 extends through the region 29 at the metal contact 44, electrically connecting the metal contact 44 to the substrate 28.

With reference to FIG. 5, the first surface 32a of the structural body 32 is coated by a layer of passivating material 50 such as silicon nitride ($Si_3N_4$), for example, having a thickness of between 1-3 μm.

The passivating layer 50 is shaped by means of lithographic and etching steps, using a third mask 52 and selectively etching the passivating layer 50. In particular, the third mask 52 covers and protects from etching the portions of the passivating layer 50 that extend in areas corresponding to the TMOS transistor 26, the third bonding ring 40, the fourth bonding ring 42, the metal contact 44, the conductive pad 38, and the dielectric layer 36 that insulates the conductive pad 38 at the side.

Then (FIG. 6), a second etch is carried out, such as a dry etch or DRIE, to remove selective portions of the structural body 32 in areas corresponding to the exposed regions (i.e., no longer covered by the passivating layer 50). In this step, the passivating layer 50 functions as etching mask, to protect the surface regions of the wafer 200 covered by the passivating layer 50. Removal of the selective portions of the structural body 32 proceeds until the substrate 28 is reached.

Next, the passivating layer 50 is completely removed from the wafer 200. The portions of the wafer 200 that were covered by the third mask 52 during the etching step 51 of FIG. 5 are thus exposed.

Once again with reference to FIG. 6, the third bonding ring 40 delimits, at the top, a first ring region 60, which is formed by a portion of the structural body 32 not previously removed and extends underneath the third bonding ring 40. The fourth bonding ring 42 delimits, at the top, a second ring region 62, which is formed by a respective portion of the structural body 32 not previously removed and extends underneath the fourth bonding ring 42. A region 64 completely houses the TMOS transistor 26, whereas a region 66 completely houses the conductive through vias 35 and the conductive pad 38, and is covered on the surface by the dielectric layer 36. A region 68 is moreover formed, which is delimited, at the top, by the metal contact 44 and houses the conductive through via 46.

Figure 7:
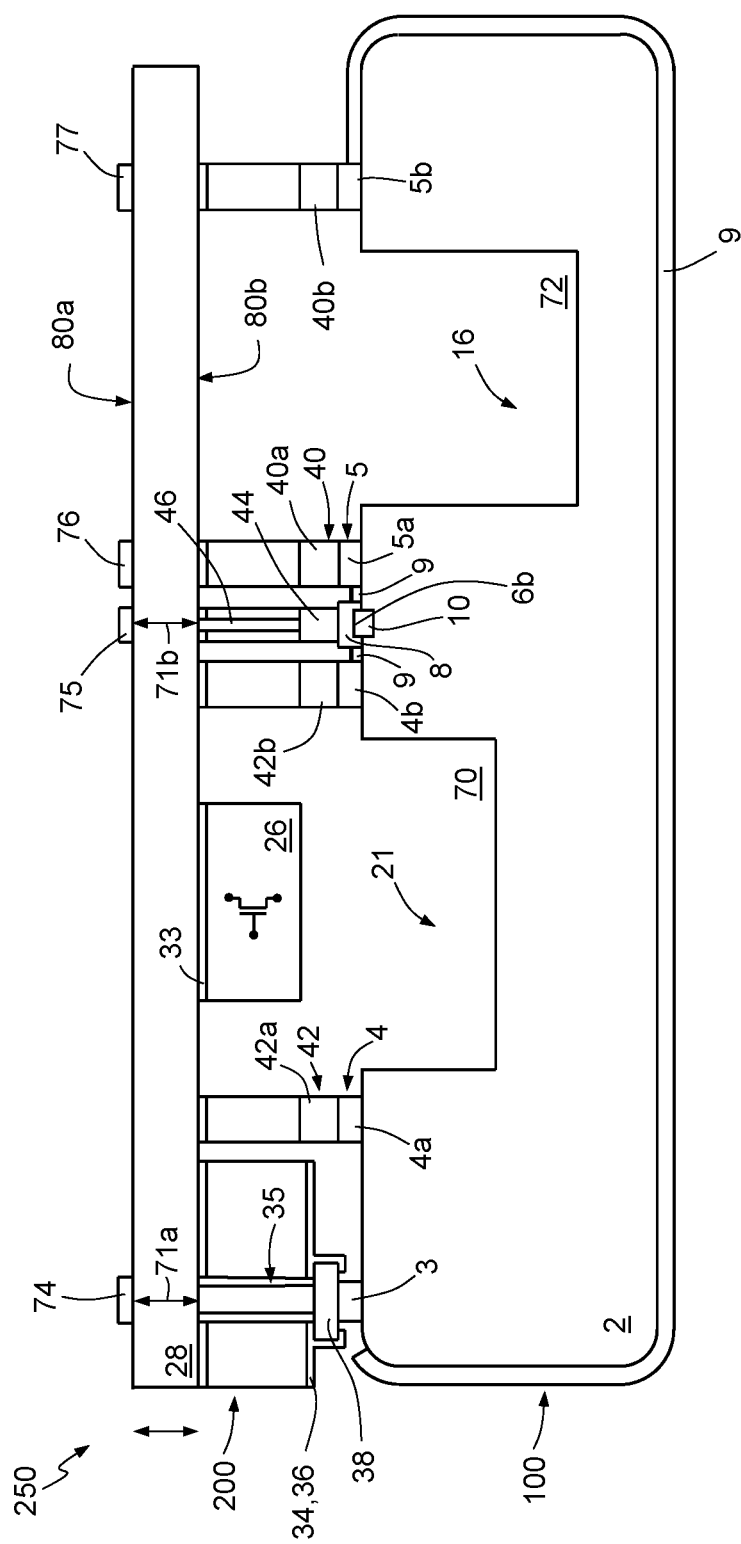

With reference to FIG. 7, the wafer 200 of FIG. 6 is flipped over through 180° and set in contact with the wafer 100 of FIG. 3, according to the method known in the art as "flip-chip".

In particular, this method is carried out so as to set in electrical contact: the bonding pad 3 with the conductive pad 38; the metal contact 44 with the metal contact 8; the first bonding ring 4 with the fourth bonding ring 42; and the second bonding ring 5 with the third bonding ring 40.

A stack 250 is thus obtained, formed by the wafer 200 set on top of the wafer 100, along the Z axis.

The electrical contacts thus formed are then heated, for example, by means of a step of heating to a temperature ranging between 200° C. and 400° C. of the stack 250, in order to create the eutectic alloy between the metal of the elements 3, 4, 8, 5 and the metal of the respective elements 38, 42, 44, and 40.

The contact between the first bonding ring 4 and the fourth bonding ring 42 defines a first chamber 70 that is in adapted to house the TMOS transistor 26, which thus faces the second trench 21.

The contact between the second bonding ring 5 and the third bonding ring 40 defines a second chamber 72, which is adapted to house the micromirror, which will thus face the first trench 16.

The substrate 28 has a first surface 80a and a second surface 80b, opposite to each other along the Z axis. The second surface 80b of the substrate 28 (belonging to the wafer 200) faces the first surface 2a of the substrate 2 (belonging to the wafer 100). The first surface 80a of the substrate 28 is, instead, exposed towards an external environment.

This is followed by lapping of the first surface 80a of the substrate 28, with reduction, if necessary, of the thickness thereof along the Z axis until a final thickness of some tens of micrometers and, for example, of approximately 65 μm is reached.

Then, on the first surface 80a of the substrate 28, with deposition, lithographic, and etching techniques known in the art, metal contacts 74-77 are formed. The metal contacts 74-77 are, for example, made of aluminum, titanium, or gold, or a titanium-gold alloy. In particular, the metal contact 74 is formed vertically aligned (i.e., along the Z axis) with the conductive pad 38, the metal contact 75 is vertically aligned to the metal contact 44, the metal contact 76 is, according to a non-limiting embodiment, vertically aligned with the section 40a of the third bonding ring 40, and the metal contact 77 is, according to a non-limiting embodiment, vertically aligned with the section 40b of the third bonding ring 40. More in general, and in a way that does not imply any limitation of the present invention, the metal contacts 76 and 77 are vertically aligned with respective portions of the bonding ring 5 and of the bonding ring 40.

The metal contacts 74 and 75 are electrically coupled to the conductive through via 35 and 46, respectively, by means of conductive paths and/or through vias 71a, 71b internal to the substrate 28 and previously obtained for said purpose, whereas the metal contacts 76, 77 are electrically coupled to the substrate 28 (or to the conductive regions thereof).

In this way, the metal contact 74 forms a pad for supply of the current signal coming from the TMOS transistor 26.

The through via 35 connects the TMOS transistor to the metal contact 74 and passes inside the dielectric layers of the stack formed so far. The contact 38, which is typically used for wire bonding to read the output signal is, in this context, used as further bonding layer. Given that the TMOS transistor 26 is flipped over on account of the flip-chip operation described previously, the via 35 carries the signal to the metal contact 74 through the silicon, to enable, for example, via wire bonding, reading of the signal of the TMOS transistor 26 supplied at the metal contact 74. The metal contact 75 is adapted to function as an earth contact for the micromirror. The metal contact 76 and the metal contact 77 supply the driving currents to the rotor and to the stator of the micromirror, as illustrated more fully hereinafter.

Figure 8:
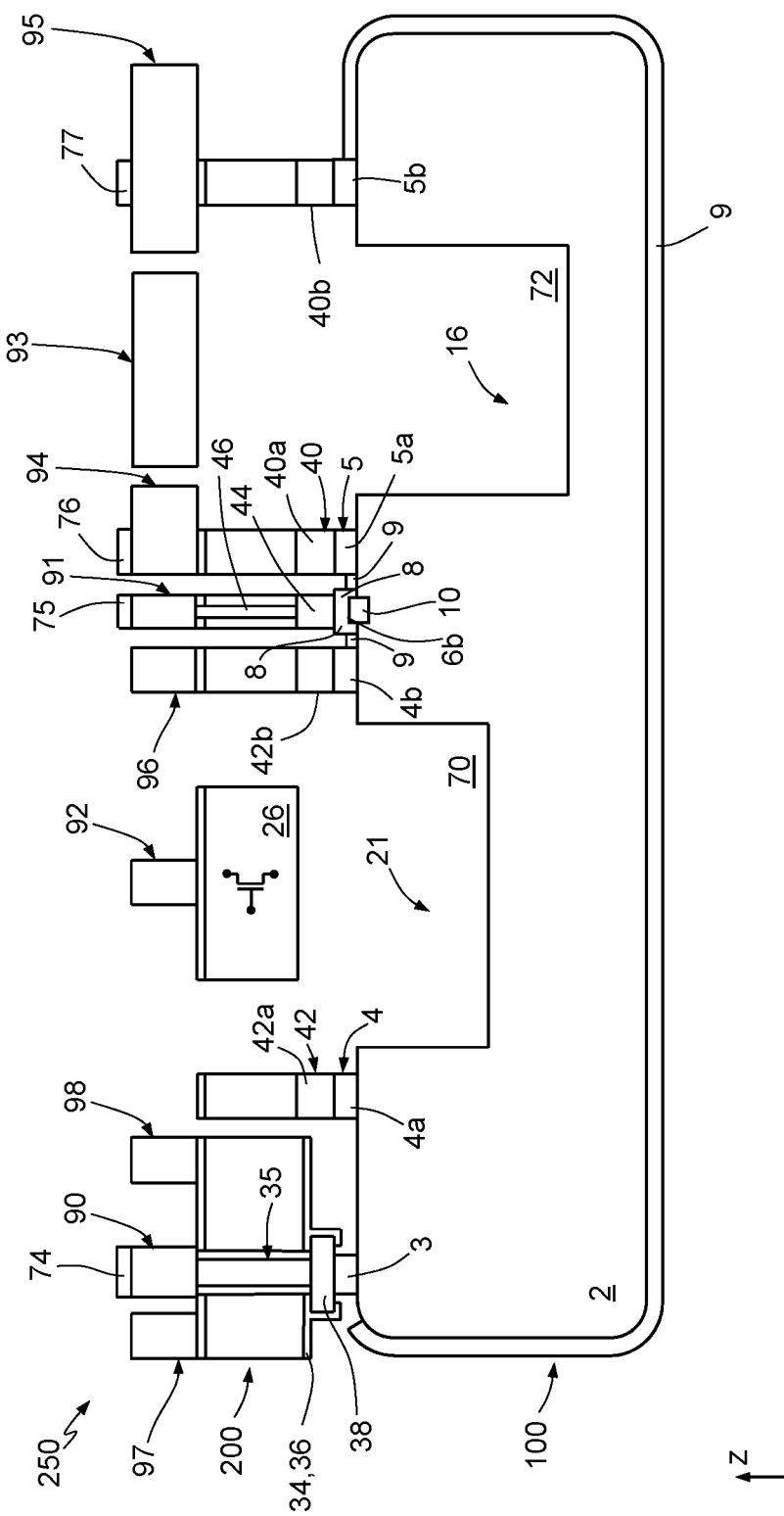

In particular, with reference to FIG. 8, further lithographic and etching steps (not illustrated in detail) are carried out, for shaping the substrate 28 at the surface 80a.

In particular, the substrate 28 is etched to form a plurality of functional regions.

A first region 90 of the substrate 28 is delimited, at the top, by the metal contact 74, and a second region 91 is delimited, at the top, by the metal contact 75. The first and the second regions 90, 91 have the function of defining points of electrical contact for acquiring the output signal of the TMOS transistor 26 and for providing a ground reference signal, respectively.

A third region 92 of the substrate 28 houses the TMOS transistor 26.

A fourth region 93 of the substrate 28 forms a portion of the micromirror, in particular the mobile mass that carries the reflecting element, suspended over the cavity 72 and over the first trench 16 by means of torsion springs of a type in itself known in the art.

A fifth region 94 of the substrate 28 carries, at the top, the metal contact 76 and forms the rotor of the micromirror. A sixth region 95 of the substrate 28 carries, at the top, the metal contact 77 and forms the stator of the micromirror. Both the fifth region 94 (rotor) and the sixth region 95 (stator) are capacitively coupled to the fourth region 93 (mobile mass) in a way in itself known in the art and such that, when appropriately biased, generate an oscillation of the mobile mass of the micromirror. The stator and rotor of the micromirror are biased, in use, via the respective metal contacts 76 and 77.

Moreover, a seventh region 96 extends so as to correspond vertically with the section 42b of the fourth bonding ring 42. An eighth region 97 and a ninth region 98 extend laterally alongside the first region 90.

It may be noted that the regions 90-97 mentioned previously are electrically insulated from one another.

Figure 9:
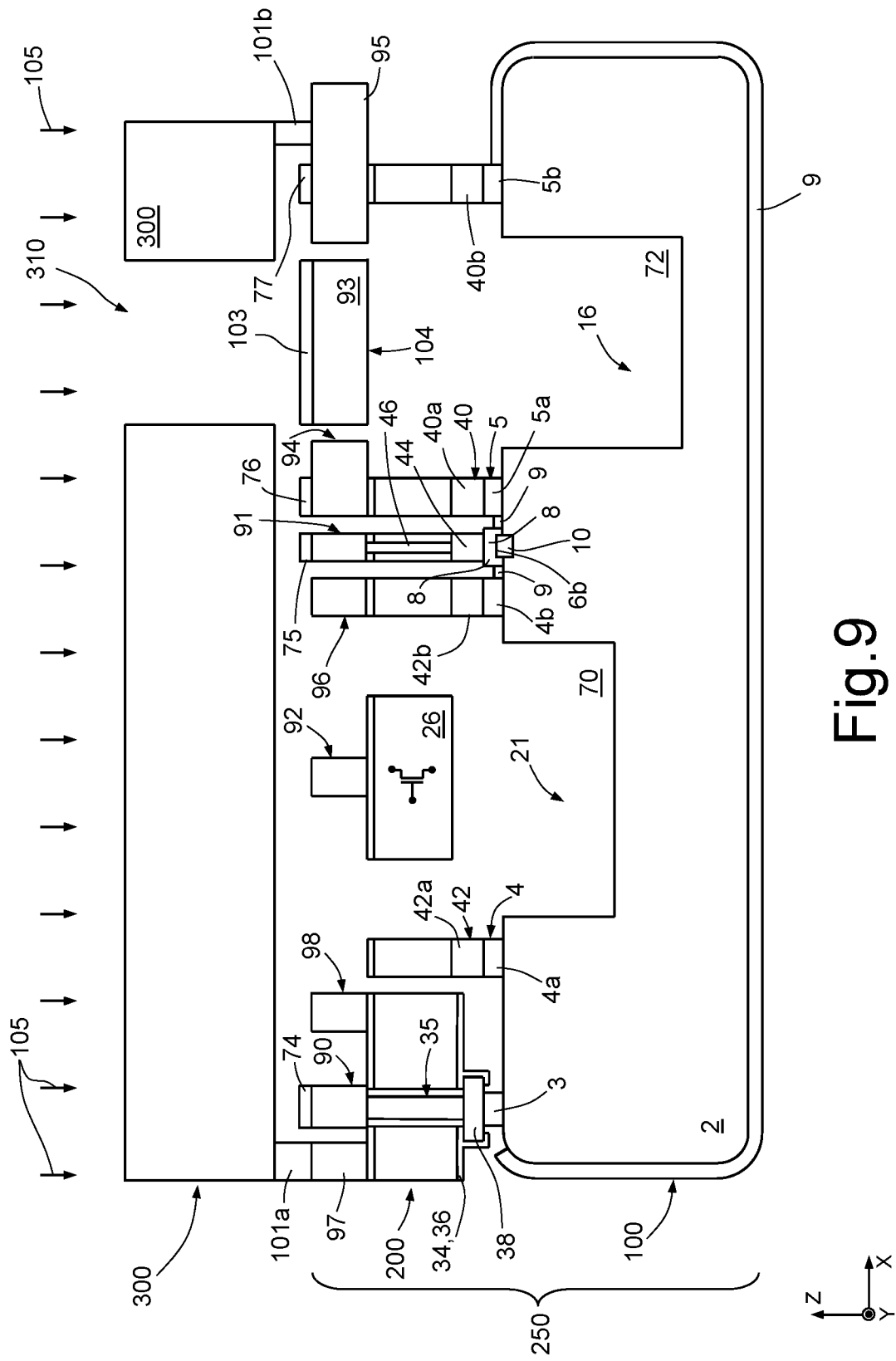

With reference to FIG. 9, a third wafer 300 (e.g., having a thickness ranging between 300 μm and 700 μm, preferably 400 μm) is coupled to the stack 250, in particular on the second wafer 200.

In particular, two or more coupling (or bonding) elements 101a, 101b are arranged so as to mechanically couple the third wafer 300 to the second wafer 200. In particular, the coupling elements 101a, 101b are arranged so as to be external to the metal contacts 74 and 77, respectively. For instance, the coupling element 101a is coupled to the eighth region 97, whereas a coupling element 101b is coupled to the sixth region 95.

The coupling elements 101a, 101b have a shape, extension, and thickness such as to structurally support the third wafer 300 and to avoid contact of the third wafer 300 with the second wafer 200 (except, of course, for the coupling points between the two wafers 200, 300).

The coupling elements 101a, 101b may be formed via sputtering of a metal alloy comprising aluminum and copper, and fixed to the wafers 300 and 200 via low-temperature temporary bonding.

The third wafer 300 has the function of mask for enabling protection and handling of the stack 250, and may be made of semiconductor material, such as silicon. The wafer 300 is subjected to lithographic and etching steps to form an opening 310 at the mobile mass 93 of the micromirror. The opening 310 may be formed prior to the step of coupling between the wafer 300 and the stack 250, or else subsequently, according to respective modalities evident to the person skilled in the art.

A step of deposition of reflecting material, for example metal material, (step designated by arrows 105 in FIG. 9) is carried out, for example, via the sputtering technique. This step of metal deposition 105 enables creation of a metal layer 103 on the areas not covered by the third wafer 300, i.e., on the fourth region 93 (mobile mass of the micromirror). The metal layer 103 may be constituted by a highly reflecting metal (for example, with a reflection coefficient higher than 95%—typically between 95% and 98%), such as aluminum or gold, or AlCu. Manufacturing of the micromirror (designated by the reference 104 in FIG. 9) is thus completed.

Once metal deposition is finished, both the third wafer 300 and the coupling elements 101a, 101b are removed.

This is followed by steps of manufacturing a protective cap for the stack 250 thus obtained.

An embodiment of the protective cap is described in what follows, with reference to FIGS. 10A-11.

With reference to FIG. 10A, a fourth wafer 400 is processed to create the protective cap. In particular, the fourth wafer 400 comprises a substrate 111 of semiconductor material, such as silicon, having a first surface 111a and a second surface 111b. The thickness of the substrate 111, between the first surface 111a and the second 111b surface (i.e., along the Z axis), ranges between approximately 300

μm and 800 μm, for example, 400 μm. The substrate 111 may be of a pre-processed type and may include, for example, one or more epitaxial layers.

In a machining step, the fourth wafer 400 is subjected to lithographic and etching steps to remove selective portions of the substrate 111 in order to form a recess 111a' at the first surface 111a. The recess 111a' is formed in a region of the wafer 400 that, in subsequent manufacturing steps (FIG. 11) will be orientated facing the stack 250, in particular facing the TMOS transistor 26.

The recess 111a' has a depth, along the Z axis starting from the first surface 111a, equal to, for example, approximately 5 μm, and a width, along the X axis, equal to, for example, approximately 50 μm. In top plan view in the plane XY defined by the X and Y axes, the recess has a quadrangular shape, for example square, or else a circular or generically polygonal shape. The recess 111a' is configured to house a gas-absorbing material, known in the art as "getter", which is designated in FIG. 10A by the reference 110.

The getter 110 is usually made of material deposited in the form of a layer, and has the function of absorbing specific gas molecules. Materials used as getter layer are known in the art, and comprise, for example, metals such as aluminum (Al), barium (Ba), zirconium (Zr), titanium (Ti), vanadium (V), iron (Fe), or mixtures or alloys thereof, such as zirconium-aluminum, zirconium-vanadium-iron, zirconium-nickel, zirconium-cobalt (in particular, an alloy of Zr/Co/O). The getter material may be deposited in the recess 111a' by means of a lift-off process. In this case, the same photoresist used for photolithographic definition of the recess 111a' is kept on the wafer 400 also during the step of deposition of the getter material. A subsequent lift-off step enables removal of the photoresist from the wafer 400 and retention of the getter material only inside the recess 111a', in a self-aligned way.

Moreover, a plurality of coupling regions is formed, in particular glassfrit regions, 112-114, the section views of which (112a, 112b; 113a, 113b; 114a, 114b) are illustrated in FIG. 10A. Each coupling region has a thickness, along the Z axis, equal to, for example, approximately 5 μm and a width, in a section view along the X axis, equal to, for example, approximately 10 μm.

The coupling region 112 is, in top plan view in the plane XY, a ring that internally encloses the coupling regions 113, 114 and the getter 110. In a different embodiment, the coupling region 112 is not a ring, and is instead formed by a plurality of regions physically separated from one another.

The coupling region 113 is, in top plan view in the plane XY, a ring having a diameter greater than the distance, along X, between the stator and the rotor of the micromirror 104 so that, when the wafer 400 is coupled to the stack 250 (FIG. 11), the coupling region 113 extends outside the stator and rotor regions (or in positions corresponding thereto), completely surrounding the micromirror 104.

It is evident that the coupling region 113 may not be a ring and may be, instead, formed by a plurality of regions physically separated from one another and such as to surround the micromirror 104 only partially. In fact, the micromirror 104 does not need to be located in a closed or air-tight chamber.

The coupling region 114 is, in top plan view in the plane XY, a ring that internally encloses the getter 110. When the wafer 400 is coupled to the stack 250 (FIG. 11), the coupling region 114 forms an air-tight coupling, insulating an internal environment, including the getter, from an external environment, as illustrated more fully in what follows. For this purpose, the coupling region 114 completely surrounds the getter 110 and may in any case have a shape different from the circular one, for example, oval or polygonal.

The structure of FIG. 10A then undergoes (FIG. 10B) a lithographic and etching process, for example, a RIE or DRIE process, for removing selective portions of the fourth wafer 400, throughout its thickness.

In particular, the fourth wafer 400 is etched so as to remove regions of the wafer 400 not protected at the top by the coupling regions 112-114. The wafer 400 is moreover not etched at the internal surface delimited by the coupling region 114 (where the getter 110 is present). A plurality of structural support regions 120-123, and a covering region 124 is thus formed.

A first through opening 131 which extends in a position corresponding to the rotor contact 76, between the structural support region 122 and the covering region 124, and is shaped so as to form an access for providing electrical contact (for example, by means of wire bonding) with the rotor contact 76. A second through opening 133 which extends in a position corresponding to the stator contact 77, between the structural support region 120 and the structural support region 121 and is shaped so as to form an access for providing electrical contact (for example, by means of wire bonding) with the stator contact 77. A third through opening 134 which extends in a position corresponding to the micromirror 104, between the structural support region 121 and the structural support region 122, and is shaped so as to form an optical access for the radiation incident on and coming out of the reflecting layer 103 of the micromirror 104. A fourth through opening 135 which extends in a position corresponding to the metal contact 74, between the structural support region 123 and the covering region 124, and is shaped so as to form an access for providing electrical contact (for example, by means of wire bonding) with the metal contact 74.

As illustrated in reference to FIG. 11, the structure of FIG. 10B is set in contact with the stack 250 of FIG. 9 (with the flip-chip method).

In particular, the coupling region 112, which is more external, is set in contact with the eighth region 97 and with the sixth region 95 of the second wafer 200; the coupling region 114 is set in contact with the ninth region 98 and with the seventh region 96; the coupling region 113 is set in contact with the fifth region 94 and with the sixth region 95.

In greater detail, the coupling region 112 extends outside the metal contacts 74 and 77, which are accessible from outside through the holes previously made through the wafer 400; the coupling region 114 completely surrounds, in top plan view in the plane XY, the TMOS transistor 26, to form an air-tight chamber 140, fluidically insulated from the environment external to said chamber 140; the coupling region 113 surrounds (at least partially, as described previously) the mobile mass of the micromirror 104, exposing the reflecting layer of the micromirror 104, which is thus accessible from outside for a light beam incident thereon. Also the metal contacts 76 and 75 are accessible through the holes previously made through the wafer 400.

After coupling between the wafer 400 and the stack 250, the structure thus formed (stack 450) is heated to a high temperature (for example 350-450° C.) to bring about melting of the glassfrit of the coupling regions 112-114 and achieve a permanent bonding of the wafer 400 to the wafer 200.

This is followed by activation of the getter 110 to generate a pressure P1, inside the chamber 140 that houses the TMOS transistor, lower than the pressure P2 outside the chamber 140. For instance, the pressure P1 ranges between $10^{-2}$ and $10^{-3}$ mbar.

The micromirror 104 (in particular, the mobile mass) is actuated capacitively, by appropriately biasing (in a way that is in itself known in the art and does not form the subject of the present invention) the rotor (i.e., the fifth region 94 enabling biasing via the metal contact 76) and the stator (enabling biasing via the metal contact 77). Said biasing causes an unbalancing of the mobile mass, which is driven in oscillation, in particular at its resonance frequency.

Figure 12:
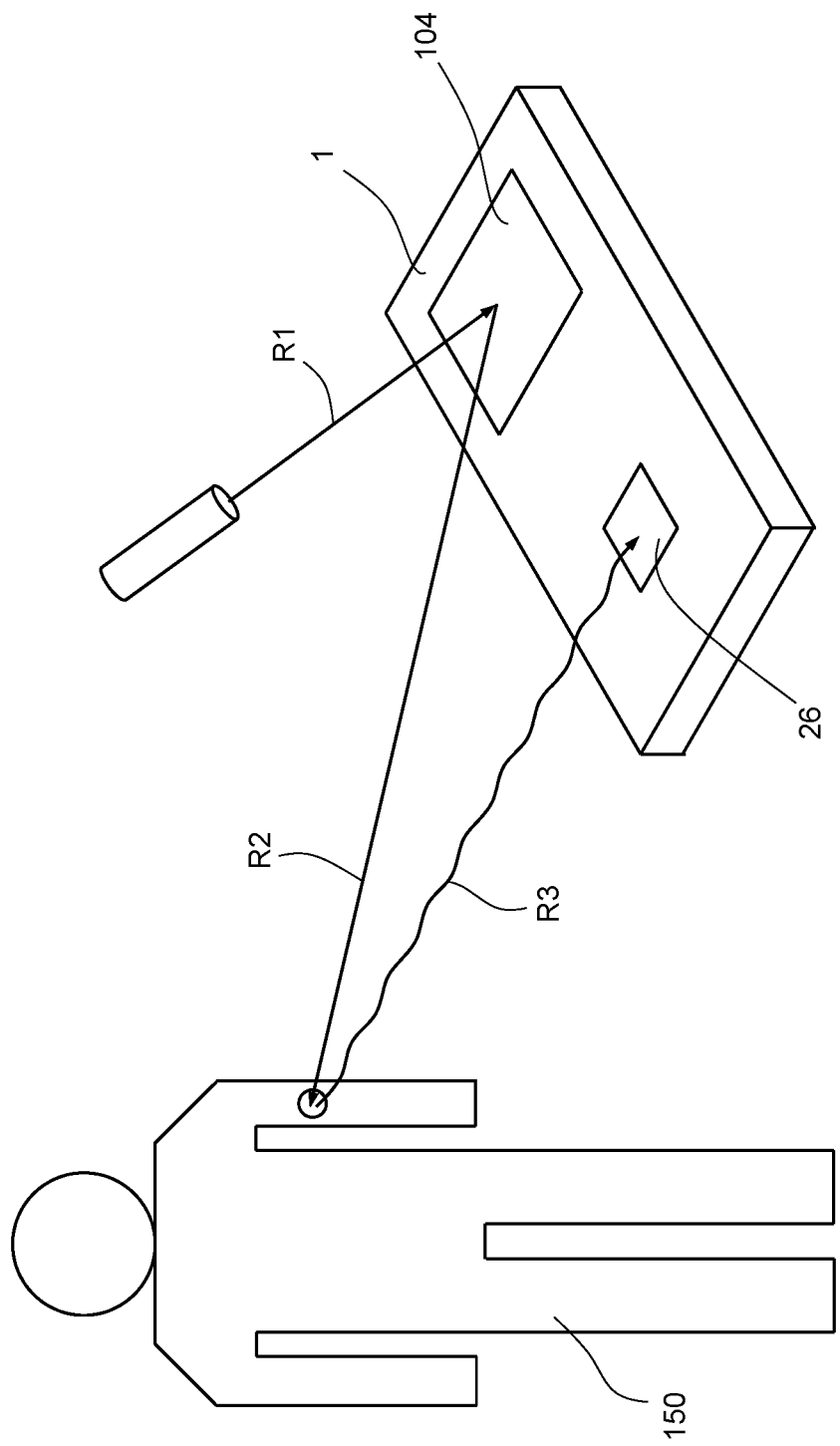
FIG. 12 is a schematic illustration of a system that includes the integrated component manufactured according to the steps of FIGS. 1-11.

With joint reference to FIGS. 11 and 12, during use, the micromirror 104 receives light radiation R1 on the reflecting layer through the corresponding opening in the wafer 400, and directs reflected light radiation R2 towards a point in space or a body 150 (for example, a region of the body of a patient).

Incidence of said light radiation R2 on the body 150 causes an increase in the temperature thereof, and a consequent emission of radiation R3 by said body 150, with an intensity that depends upon the temperature of the body 150 itself.

Since the TMOS transistor 26 is sensitive to electromagnetic radiation R3 emitted by the body 150, the rise in temperature of the body 150 is detected by the TMOS transistor 26 and transduced into a current signal at output from the TMOS transistor 26. The vacuum present in the chamber 140 that houses the TMOS transistor 26 thermally decouples the chamber 140 from the external environment, and enables an increase in the accuracy of the measurement.

Even though the electromagnetic radiation R3 emitted by the heated body 150 impinges upon the back of the TMOS transistor 26, this does not create problems of measurement since the measurement of temperature is independent of the direction of incidence of the electromagnetic radiation on the TMOS transistor 26.

It is moreover known in the art that a warm body emits electromagnetic radiation in the infrared, and that this electromagnetic radiation is not absorbed and blocked to a significant extent by a layer of semiconductor material having a thickness of some hundreds of micrometers, such as the region 124 of the wafer 400 that covers the chamber 140. Consequently, the covering region 124 does not prevent the electromagnetic radiation from reaching the TMOS transistor 26 so that it can be detected.

It is, instead, expedient for the region above the micromirror 104 not to be covered by a layer of material such as to block the light radiation incident upon the reflecting layer.

The electrical signal generated at output from the TMOS transistor 26 is acquired via the metal contact 74, to be subsequently processed.

Figure 13:
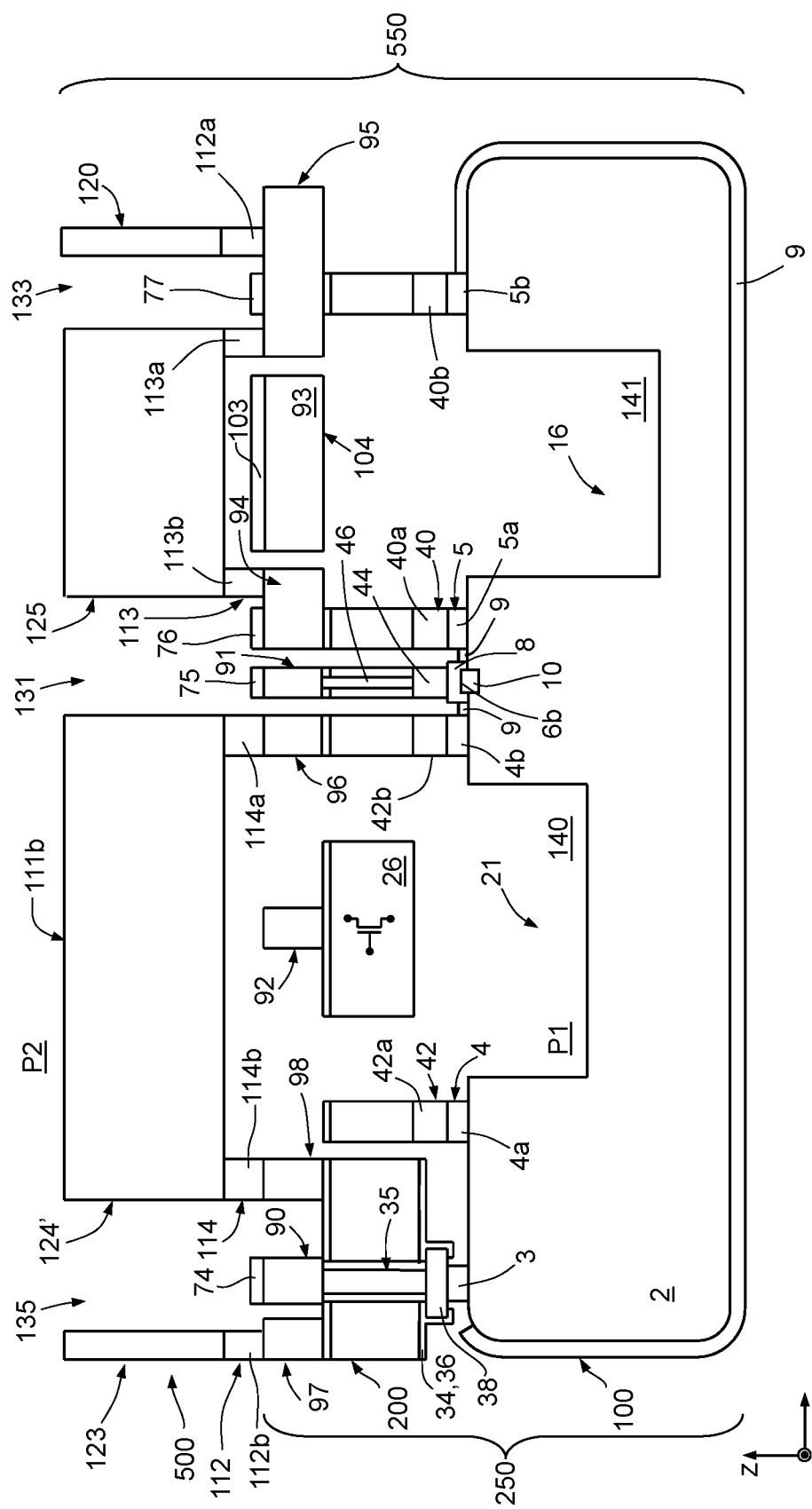
FIG. 13 shows an integrated component according to a further embodiment.

FIG. 13 shows a further embodiment of the protective cap.

In this case, the cap is not obtained via machining of a wafer 400 of semiconductor material, but using a wafer 500 of material transparent to the light radiation that, in use, impinges upon the reflecting layer of the micromirror 104 (for example, glass).

The wafer 500 is machined with techniques in themselves known in a way similar to what is illustrated in FIGS. 10A and 10B for the wafer 400 to form a covering region 124' for the TMOS transistor 26 similar to the covering region 124 described previously and having similar functions. However, in this case, through openings are formed passing through the wafer 500 only at the regions which (when the wafer 500 and the stack 250 are coupled together) are aligned, along the Z axis, with the metal contacts 74, 75, 76, and 77.

Coupling between the wafer 500 and the stack 250 is obtained by means of the flip-chip process, to obtain the stack 550 of FIG. 14.

In the embodiment of FIG. 13, the getter is absent.

A covering region 125 (e.g., as has been said, made of glass) is instead present, which extends over the reflecting layer of the micromirror 104.

The wafer 500 is coupled to the wafer 200 by means of coupling regions 112-114 similar to the ones described with reference to FIGS. 10A-11 and consequently designated by the same reference numbers.

To obtain the pressure P1 (which is lower than P2) inside the chamber 140 that houses the TMOS transistor 26, coupling between the wafer 500 and the stack 250 is made in an environment at the pressure P1.

The micromirror covering region 125 enables protection of the micromirror 104 and at the same time allows penetration of the light radiation that comes from outside and impinges, in use, upon the reflecting layer of the mobile mass.

In this embodiment, both the chamber of the micromirror 141 and the chamber of the TMOS transistor 140 are in a low-pressure condition (P1).

From an examination of the characteristics of the invention provided according to the present disclosure, the advantages that it affords are evident.

In particular, integration of a micromirror and of a TMOS transistor in one and the same wafer enables reduction of the area necessary for manufacturing the system comprising the TMOS transistor and the micromirror, and hence makes it possible to obtain a device that is small and easy to handle.

The measurement using the TMOS transistor is more accurate than what is currently available in the prior art, and this is due to the possibility of controlling the radiation incident on the body to be heated via the micromirror, in an efficient and precise way.

Use of a compact and integrated system enables reduction of the time necessary to obtain the result of the measurement, and moreover enables use thereof at room temperature.

Use of a TMOS transistor integrated with a micromirror facilitates identification of known illnesses and disorders, with consequent positive effects for the purposes of preventive medicine.

The above integrated component can moreover be readily generalized to make up for multiple needs, not exclusively in the diagnostic field. These variants may be obtained by adjusting the parameters of the TMOS transistor as a function of the frequency in the infrared that is to be measured and that depends upon the application itself.

Finally, it is clear that modifications and variations may be made to the invention described and illustrated herein, without thereby departing from the scope thereof, as defined in the annexed claims.

In particular, an alternative embodiment comprises an integrated component 1 in which the covering region 124 is absent. Consequently, the TMOS transistor 26 is not insulated fluidically and thermally from the external environment. Noise in the measurement of the electromagnetic radiation R3 by the TMOS transistor 26, due, for example, to thermal fluctuations of the external environment, may be eliminated by carrying out this measurement in a differential mode with the aid, for example, of a temperature sensor integrated in the component 1, or otherwise coupled to the component 1, or arranged in the proximity of the component 1. This temperature sensor is adapted to record the temperature of the external environment and to supply at output an electrical signal proportional thereto: the effect of the thermal fluctuations of the external environment can thus be subtracted from the electrical signal coming out of the TMOS transistor 26, enabling a high degree of accuracy of measurement even in the absence of the covering region 124 and of the air-tight chamber 140.

The invention claimed is:

1. A method of manufacturing an integrated component, comprising:
   providing a first wafer of semiconductor material, said first wafer having a surface;
   providing a second wafer of semiconductor material, said second wafer including a substrate and a structural layer on the substrate, the structural layer integrating a detector device configured to detect electromagnetic radiation;
   coupling the structural layer of the second wafer to the surface of the first wafer; and
   processing the substrate of the second wafer to form a stator, a rotor, and a mobile mass of a micromirror, said stator and rotor forming a capacitive-driving assembly for capacitively driving the mobile mass.

2. The method according to claim 1, further comprising coupling a first cap to the substrate of the second wafer in correspondence of the detector device, and
   wherein coupling the structural layer and coupling the first cap are carried out so as to form a first air-tight chamber that houses said detector device.

3. The method according to claim 2, further comprising coupling a second cap to the substrate of the second wafer at the micromirror, and
   wherein coupling the structural layer and coupling the second cap are carried out so as to form a second air-tight chamber that houses said micromirror.

4. The method according to claim 2, further comprising:
   forming a stator contact that is electrically coupled to the stator of the micromirror; and
   forming a rotor contact that is electrically coupled to the rotor of the micromirror,
   wherein coupling the first cap includes coupling a third wafer to the substrate of the second wafer, and shaping the third wafer so as to form: said first cap, a first through opening at the rotor contact, and a second through opening at the stator contact.

5. The method according to claim 4, further comprising coupling a second cap to the substrate of the second wafer at the micromirror, and
   wherein coupling the structural layer and coupling the second cap are carried out so as to form a second air-tight chamber that houses said micromirror.

6. The method according to claim 5, wherein coupling the second cap includes shaping the third wafer so as to form: said first cap, said second cap, the first through opening, and the second through opening.

7. The method according to claim 5, wherein the first cap and the second cap are jointly formed by machining of one and the same wafer of glass.

8. The method according to claim 1, wherein coupling the structural layer of the second wafer to the surface of the first wafer includes:
   forming a first coupling ring on the structural layer to surround the detector device, the first coupling ring made of a first material;
   forming a second coupling ring on the surface of the first wafer, the second coupling ring made of a second material;
   placing the first and the second coupling rings in mutual contact; and
   carrying out a thermal treatment to form a eutectic bond between the first and the second materials.

9. The method according to claim 1, further comprising:
   coupling a first cap to the substrate of the second wafer in correspondence of the detector device;
   wherein coupling the structural layer and coupling the first cap are carried out so as to form a first air-tight chamber that houses said detector device;
   forming a recess in the first cap, said recess extending out onto the air-tight chamber; and
   installing a getter material in the recess.

10. The method according to claim 1, further comprising:
    forming in the first wafer, starting from the surface, a first trench and a second trench; and
    processing at least the first trench to reduce a reflectivity thereof,
    wherein coupling the structural layer of the second wafer to the surface of the first wafer includes arranging the second trench facing the detector device; and
    wherein processing the substrate of the second wafer includes forming the stator, the rotor, and the mobile mass so that they face the first trench.

11. A method of manufacturing an integrated component, comprising:
    providing a first wafer of semiconductor material, said first wafer having a surface;
    providing a second wafer of semiconductor material, said second wafer including a substrate and a structural layer on the substrate, the structural layer integrating an electrical circuit comprising an electromagnetic radiation detection circuit;
    coupling the structural layer of the second wafer to the surface of the first wafer; and
    processing the substrate of the second wafer to form a microelectromechanical system (MEMS) device comprising a stator, a rotor, and a mobile mass of a micromirror, said stator and rotor forming a capacitive-driving assembly for capacitively driving the mobile mass.

12. The method according to claim 11, further comprising coupling a first cap to the substrate of the second wafer to form a first air-tight chamber that houses said electrical circuit.

13. The method according to claim 12, further comprising coupling a second cap to the substrate of the second wafer at the micromirror to form a second air-tight chamber that houses said MEMS device.

14. The method according to claim 12, wherein coupling the first cap comprises:
    coupling a third wafer to the substrate of the second wafer; and
    shaping the third wafer so as to form said first cap.

15. The method according to claim 14, further comprising coupling a second cap to the substrate of the second wafer at the micromirror to form a second air-tight chamber that houses said MEMS device.

16. The method according to claim 15, wherein coupling the second cap comprises: shaping the third wafer so as to additionally form said second cap.

17. The method according to claim 11, wherein coupling the structural layer of the second wafer to the surface of the first wafer comprises:

forming a first coupling ring on the structural layer, the first coupling structure made of a first material;

forming a second coupling ring on the surface of the first wafer, the second coupling structure made of a second material;

placing the first and the second coupling structures in mutual contact; and carrying out a thermal treatment to form a eutectic bond between the first and the second materials.

18. The method according to claim 11, further comprising:

coupling a first cap to the substrate of the second wafer in correspondence of the electrical circuit;

wherein coupling the structural layer and coupling the first cap are carried out so as to form a first air-tight chamber that houses said electrical circuit;

forming a recess in the first cap, said recess extending out onto the air-tight chamber; and installing a getter material in the recess.

* * * * *